United States Patent
Jansen

(10) Patent No.: US 12,306,548 B2
(45) Date of Patent: May 20, 2025

(54) POSITIONING SYSTEM, A LITHOGRAPHIC APPARATUS, AN ABSOLUTE POSITION DETERMINATION METHOD, AND A DEVICE MANUFACTURING METHOD

(71) Applicant: ASML Netherlands B.V., Veldhoven (NL)

(72) Inventor: Maarten Jozef Jansen, Hoogeloon (NL)

(73) Assignee: ASML NETHERLANDS B.V., Veldhoven (NL)

( * ) Notice: Subject to any disclaimer, the term of this patent is extended or adjusted under 35 U.S.C. 154(b) by 212 days.

(21) Appl. No.: 18/037,641

(22) PCT Filed: Oct. 25, 2021

(86) PCT No.: PCT/EP2021/079532
§ 371 (c)(1),
(2) Date: May 18, 2023

(87) PCT Pub. No.: WO2022/111928
PCT Pub. Date: Jun. 2, 2022

(65) Prior Publication Data
US 2023/0408933 A1    Dec. 21, 2023

(30) Foreign Application Priority Data

Nov. 24, 2020   (EP) .................................... 20209459

(51) Int. Cl.
*G03F 7/00*      (2006.01)
*G01B 9/02001*   (2022.01)
(52) U.S. Cl.
CPC ... *G03F 7/706845* (2023.05); *G01B 9/02007* (2013.01)

(58) Field of Classification Search
CPC ...................... G03F 7/706845; G01B 9/02007
See application file for complete search history.

(56) References Cited

U.S. PATENT DOCUMENTS

| 5,388,115 A | 2/1995 | Kawashima et al. |
| 6,020,964 A | 2/2000 | Loopstra et al. |
| (Continued) | | |

FOREIGN PATENT DOCUMENTS

WO   WO 2019/149515 A1   8/2019

OTHER PUBLICATIONS

International Search Report and Written Opinion of the International Searching Authority directed to related International Patent Application No. PCT/EP2021/079532, mailed Jan. 28, 2022; 11 pages.

(Continued)

*Primary Examiner* — Hung V Nguyen
(74) *Attorney, Agent, or Firm* — Sterne, Kessler, Goldstein & Fox P.L.L.C.

(57) ABSTRACT

The invention provides a positioning system to determine an absolute position of a moveable target relative to a reference, comprising an interferometer system with a first light source to emit light at a fixed frequency and a second light source to emit light at at least two different frequencies. The positioning system is configured to determine, based on movement of the target, a phase difference curve associated with a first frequency of the second light source and a phase difference curve associated with a second frequency of the second light source as a function of a phase difference associated with the fixed frequency of the first light source and to determine a cross-point to determine the absolute position of the moveable target. The invention also relates to a lithographic apparatus and corresponding method.

18 Claims, 5 Drawing Sheets

(56) References Cited

U.S. PATENT DOCUMENTS

| | | | |
|---|---|---|---|
| 6,952,253 B2 | 10/2005 | Lof et al. | |
| 7,826,064 B2 * | 11/2010 | de Groot | G01B 9/02002 |
| | | | 356/508 |
| 8,379,218 B2 * | 2/2013 | Deck | G01B 9/02007 |
| | | | 356/479 |
| 8,902,431 B2 * | 12/2014 | Liesener | G01B 9/02068 |
| | | | 356/479 |
| 2007/0058173 A1 | 3/2007 | Holzapfel | |
| 2010/0235137 A1 | 9/2010 | Seo et al. | |
| 2013/0070256 A1 | 3/2013 | Tokimitsu | |
| 2013/0148129 A1 | 6/2013 | Warden et al. | |
| 2015/0019160 A1 | 1/2015 | Thurner et al. | |

OTHER PUBLICATIONS

International Preliminary Report on Patentability directed to related International Patent Application No. PCT/EP2021/079532, issued May 30, 2023; 9 pages.

\* cited by examiner

POSITIONING SYSTEM, A LITHOGRAPHIC APPARATUS, AN ABSOLUTE POSITION DETERMINATION METHOD, AND A DEVICE MANUFACTURING METHOD

CROSS-REFERENCE TO RELATED APPLICATION

The application claims priority of EP application 20209459.5 which was filed on 24 Nov. 2020 and which is incorporated herein in its entirety by reference.

FIELD

The present invention relates to a positioning system to determine an absolute position of a moveable target relative to a reference. The present invention also relates to a lithographic apparatus comprising such a positioning system. The present invention further relates to a method for determining an absolute position of a moveable target relative to a reference, and a method for manufacturing a device using a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Lithographic apparatus usually include one or more positioning systems to position an object such as a support for a patterning device, a substrate support or an optical element of a projection system or illumination system. Such positioning systems typically include interferometers which may be of the heterodyne type.

In a heterodyne interferometer, a light source is used to create a pair of light beams having a relatively small difference in frequency, which difference in frequency may be referred to as split frequency. A first portion of both light beams is tapped off and both first portions are made to interfere, after which the power of the interference result is detected by a reference detector while a second portion of one of the light beams is allowed to travel along a reference path, and a second portion of the other one of the light beams is allowed to travel along a measurement path. Both second portions are made to interfere and the power of the interference result is detected by a measurement detector. By evaluating an output signal from the measurement detector and comparing this with an output signal from the reference detector, information may be obtained about the optical path length difference of the measurement path and reference path from which position information of a target in the measurement path may be obtained.

Interferometers regularly require calibration, e.g. to obtain information about an absolute position of a target. Calibration methods used in static or nearly static interferometer applications are not suitable for moving applications or require complex adaptations or properties of the interferometer system. Current calibration methods for moving applications typically involve the simultaneous use of a plurality of light source frequencies.

SUMMARY

Considering the above, it is an object of the invention to provide an easy to use calibration of the absolute position of a moveable target using an interferometer system.

According to an embodiment of the invention, there is provided a positioning system to determine an absolute position of a moveable target relative to a reference, comprising:
  a measurement system to measure a position of the moveable target;
  an actuator system to move the moveable target; and
  a control unit to control the measurement system and the actuator system,
wherein the measurement system comprises an interferometer system with a first light source configured to emit a light beam at a fixed frequency, a second light source configured to emit a second light beam and being able to output the second light beam at a first frequency and at a second frequency, and an optics system configured to allow a portion of the first light beam to interact with the moveable target and another portion of the first light beam to travel along a fixed reference path, and to allow a portion of the second light beam to interact with the moveable target and another portion of the second light beam to travel along a fixed reference path,
and wherein the control unit is configured to determine an absolute position of the moveable target relative to a reference by:
  a. moving the moveable target;
  b. driving the second light source such that during one or more portions of the moving of the moveable target the second light beam has the first frequency and during one or more other portions of the moving of the moveable target the second light beam has the second frequency;
  c. determining at least two first points in time where the second light source has the first frequency;
  d. determining at least two second points in time where the second light source has the second frequency;
  e. determining for each of the at least two first points in time a first phase difference between portions of the second light beam as a function of a position of the moveable target determined by a phase difference between portions of the first light beam;
  f. determining for each of the at least two second points in time a second phase difference between portions of the second light beam as a function of a position of the moveable target determined by a phase difference between portions of the first light beam;

g. extrapolating a first curve fitted through the first phase differences and extrapolating a second curve fitted through the second phase differences; and h. determining a cross-point of the extrapolated first curve and the extrapolated second curve in order to determine an absolute position of the moveable target relative to the reference.

According to another embodiment of the invention, there is provided a lithographic apparatus comprising a moveable target and a positioning system according to the invention.

According to a further embodiment of the invention, there is provided a method for determining an absolute position of a moveable target relative to a reference using an interferometer system with a first light source configured to emit a light beam at a fixed frequency and a second light source configured to emit a second light beam and being able to output the second light beam at a first frequency and at a second frequency, wherein a portion of the first light beam interacts with the moveable target and another portion of the first light beam travels along a fixed reference path, wherein a portion of the second light beam interacts with the moveable target and another portion of the second light beam travels along a fixed reference path, and wherein the method comprises the following steps:

a. moving the moveable target;

b. driving the second light source such that during a portion of step a. the second light beam has the first frequency and during another portion of step a. the second light beam has the second frequency;

c. determining at least two first points in time where the second light source has the first frequency;

d. determining at least two second points in time where the second light source has the second frequency;

e. determining for each of the at least two first points in time a first phase difference between portions of the second light beam as a function of a position of the moveable target determined by a phase difference between portions of the first light beam;

f. determining for each of the at least two second points in time a second phase difference between portions of the second light beam as a function of a position of the moveable target determined by a phase difference between portions of the first light beam;

g. extrapolating a first curve fitted through the first phase differences and extrapolating a second curve fitted through the second phase differences; and h. determining a cross-point of the extrapolated first curve and the extrapolated second curve in order to determine an absolute position of the moveable target relative to the reference.

According to yet another embodiment of the invention, there is provided a device manufacturing method wherein use is made of a lithographic apparatus according to the invention.

According to yet another embodiment of the invention, there is provided a heterodyne interferometer or heterodyne interferometer system or heterodyne encoder system suitable to be used in a positioning system according to the invention. Such a heterodyne interferometer system may comprise:

a first light source configured to emit a light beam at a fixed frequency;

a second light source configured to emit a second light beam and being able to output the second light beam at a first frequency and at a second frequency;

an optics system configured to allow a portion of the first light beam to interact with the moveable target and another portion of the first light beam to travel along a fixed reference path, and to allow a portion of the second light beam to interact with the moveable target and another portion of the second light beam to travel along a fixed reference path; and a control unit, wherein the control unit is configured to determine an absolute position of the moveable target relative to a reference by:

a. driving the second light source such that during one or more portions of a movement of the moveable target the second light beam has the first frequency and during one or more other portions of the movement of the moveable target the second light beam has the second frequency;

b. determining at least two first points in time where the second light source has the first frequency;

c. determining at least two second points in time where the second light source has the second frequency;

d. determining for each of the at least two first points in time a first phase difference between portions of the second light beam as a function of a position of the moveable target determined by a phase difference between portions of the first light beam;

e. determining for each of the at least two second points in time a second phase difference between portions of the second light beam as a function of a position of the moveable target determined by a phase difference between portions of the first light beam;

f. extrapolating a first curve fitted through the first phase differences and extrapolating a second curve fitted through the second phase differences; and g. determining a cross-point of the extrapolated first curve and the extrapolated second curve in order to determine an absolute position of the moveable target relative to the reference.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
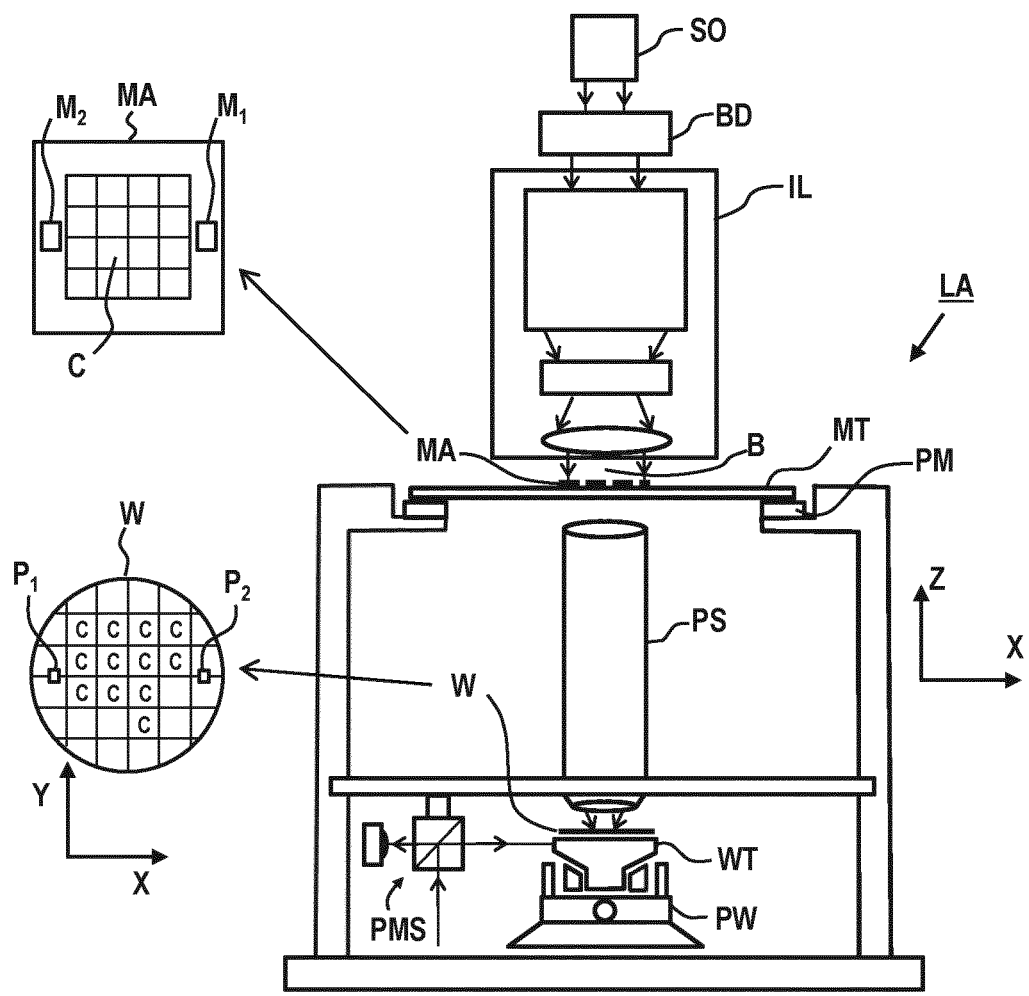
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
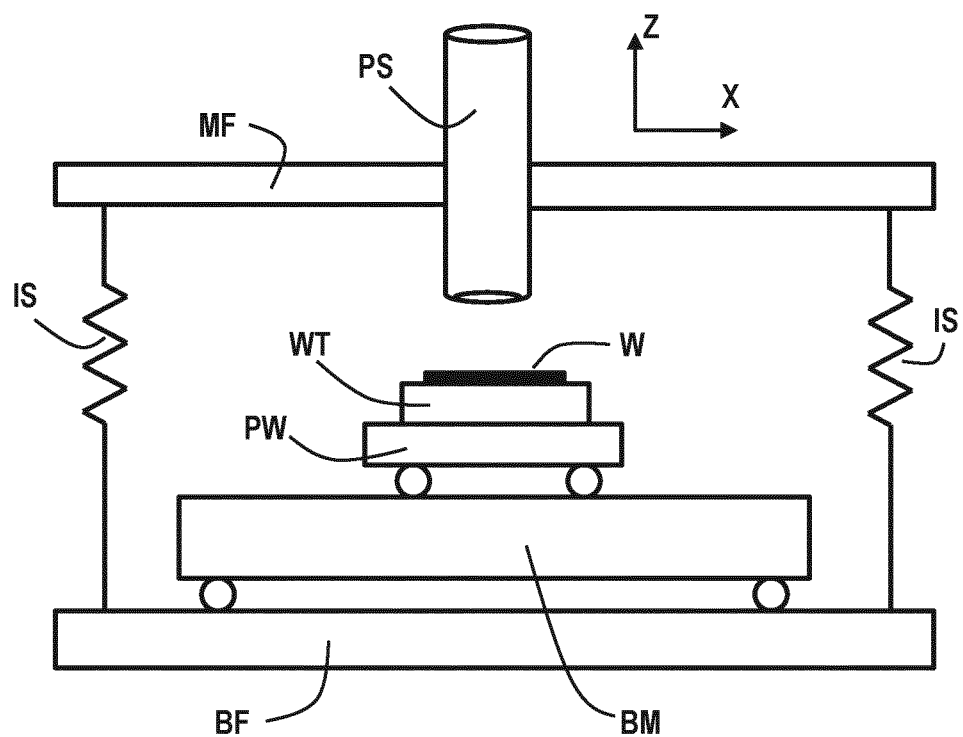
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, +1st order, −1st order, +2nd order and −2nd order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
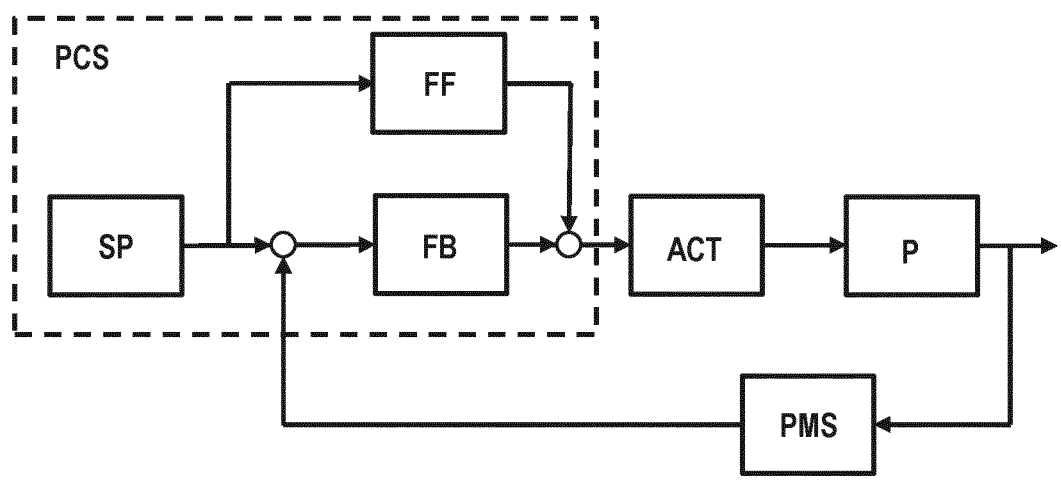
FIG. 3 schematically depicts a position control system as part of a positioning system according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
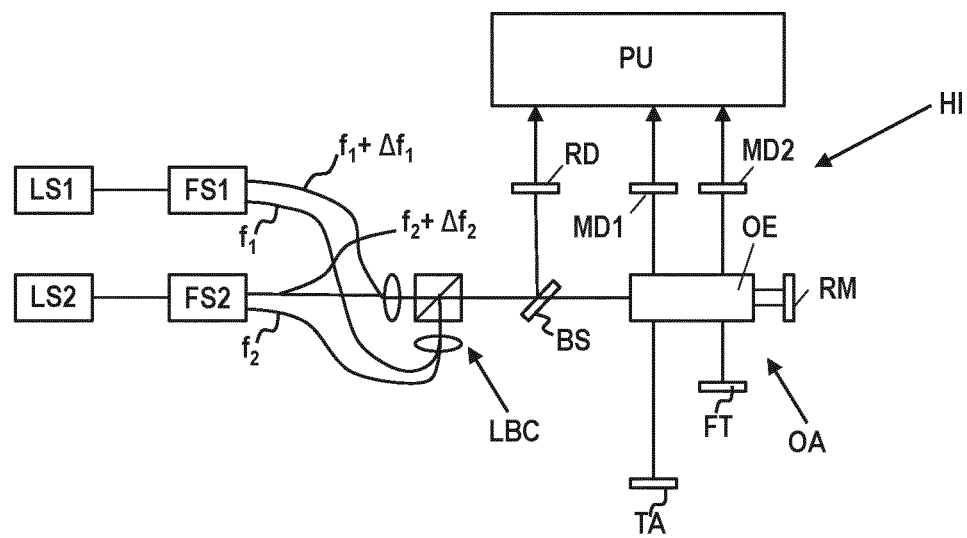
FIG. 4 schematically depicts a heterodyne interferometer or heterodyne interferometer system according to an embodiment of the invention.

FIG. 4 schematically depicts a heterodyne interferometer or heterodyne interferometer system HI according to an embodiment of the invention as part of the position measurement system PMS mentioned above.

The interferometer HI includes a plurality of light sources, here two light sources LS1 and LS2. The light sources LS1 and LS2 may be laser sources providing a respective coherent light beam of a predetermined frequency.

Each light source LS1 and LS2 has an associated frequency shifter FS1, FS2 outputting a respective pair of light beams indicated by their respective frequencies and resulting in each pair of light beams having a distinct split frequency as indicated below in table 1.

TABLE 1

Frequency shifter and light beam overview:

| Frequency shifter | Frequency of first light beam | Frequency of second light beam | Split frequency |
| --- | --- | --- | --- |
| FS1 | f1 | f1 + Δf1 | Δf1 |
| FS2 | f2 | f2 + Δf2 | Δf2 |

The plurality of light beams are combined by optical element LBC, for instance in such a way that each first light beam is orthogonally polarized to the corresponding second light beam, and directed towards a beam splitter BS. The beam splitter BS is configured to split each light beam into a first portion that is directed towards a reference detector RD and a second portion that is directed towards either a first measurement detector MD1 or a second measurement detector MD2 via an optical assembly OA.

In this embodiment, the optical assembly OA includes an optical element OE and a reference mirror RM. When referring to the light beams provided by the first frequency shifter as a first pair of light beams and when referring to the light beams provided by the second frequency shifter as a second pair of light beams, the optical element OE receives four different light beams from the beam splitter BS, namely:

a second portion of the first light beam of the first pair of light beams, alternatively referred to as first reference beam;

a second portion of the second light beam of the first pair of light beams, alternatively referred to as first measurement beam;

a second portion of the first light beam of the second pair of light beams, alternatively referred to as second reference beam; and a second portion of the second light beam of the second pair of light beams, alternatively referred to as second measurement beam.

The optical assembly OA is configured to allow a portion of the first reference beam and a portion of the second reference beam to travel along a reference path with a fixed optical path length towards the first measurement detector MD1 and to allow another portion of the first reference beam and another portion of the second reference beam to travel along a reference path with a fixed optical path length towards the second measurement detector MD2. In the schematic example of FIG. 4, the reference path leading to the first measurement detector MD1 start at the beam splitter BS runs via the optical element OE to the reference mirror RM, back to the optical element OE and ends on the first measurement detector MD1. The reference path leading to the second measurement detector MD2 starts at the beam splitter BS, runs via the optical element OE to the reference mirror RM, back to the optical element OE and ends on the second measurement detector MD2.

The optical assembly OA is further configured to allow a portion of the first measurement beam and a portion of the second measurement beam to travel along a measurement path including a moveable target TA towards the first measurement detector MD1 and to allow another portion of the first measurement beam and another portion of the second measurement beam to travel along a measurement path including a fixed target FT towards the second measurement detector MD2. In the schematic example of FIG. 4, the measurement path including moveable target TA starts at the beam splitter BS, runs via the optical element OE to the moveable target TA, back to the optical element OE and ends on the first measurement detector MD1. The measurement path including fixed target FT starts at the beam splitter BS, runs via the optical element OE to the fixed target FT, back to the optical element OE and ends on the second measurement detector MD2.

The optical element OE may be or include one or more polarizing beam splitters to perform the function as described above.

Other reference paths and measurement paths are also envisaged. In an example, portions of the first and second measurement beam are directed not once, but multiple times towards the moveable target TA and the fixed target FT, respectively. The optical assembly OA, the beam splitter BS and possibly the optical element LBC, may be referred to as the optics system configured to receive respective pairs of light beams having different split frequencies and to direct at least a portion of the light beams to at least one detector.

It is explicitly noted here that the entire heterodyne interferometer or heterodyne interferometer system, in particular the optics system and the detectors, are depicted highly schematically and elements may have been omitted for clarity reasons. For instance, properly arranged polarization-selective elements before a detector allowing the orthogonally polarized first and second beams to interfere at a detector are not separately depicted, neither are any quarter-wave plates depicted that are typically present between optical elements like optical element OE and/or a polarizing beam splitter and the target TA and between optical elements like optical element OE and/or a polarizing beam splitter and the reference mirror RM. Other optical elements known to the skilled person in the art of heterodyne interferometry may also have been omitted, but may be present for a proper functioning of the heterodyne interferometer or heterodyne interferometer system HI. Further, as an example, in a more complex configuration, each light source may have a separate beam delivery device including a separate reference detector per light source.

A characterizing feature is that the reference path and the measurement path are different so that a change of the difference between the paths can be measured. In case of a moveable target, like the moveable target TA, a change of the difference in optical path length can be measured, thereby allowing to measure a position change of the moveable target TA. In case of a static target, like the fixed target FT, a difference in environmental conditions may be measurable, e.g. a change in refractive index, and/or a frequency stability of the light sources LS1, LS2 may be measurable, for instance by measuring a change in wavelength. It is also envisaged that the measurement path is such that the light beam is directed to and reflected by the moveable or fixed target multiple times to increase the optical path length and induced difference in optical path length when a displacement of the moveable target TA or change in environmental condition occurs.

Output signals of the reference detector RD, the first measurement detector MD1, and the second measurement detector MD2 are provided to a processing unit PU. It is also envisaged that a separate processing unit PU is provided per detector RD, MD1, MD2.

Different operations of the processing unit PU depending on different embodiments of the interferometer system HI of FIG. 4 will now be described by reference to FIGS. 5-9.

In an embodiment, the first light source LS1 is a stabilized laser source, e.g. a Helium-Neon laser.

Figure 5:
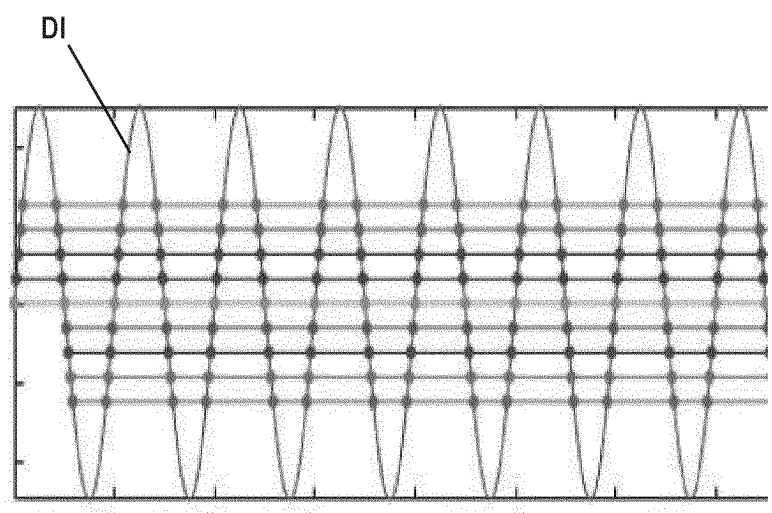
FIG. 5 schematically depicts a diagram of a phase difference as a function of time in relation to the fixed target of the heterodyne interferometer system of FIG. 4 in response to a continuously modulated second light source.

In an embodiment, the second light source LS2 is a tunable laser source that may be continuously modulated. The processing unit PU may be configured to determine from the output signal of the second measurement detector MD2 a phase difference between the portion of the first measurement beam and the portion of the first reference beam and a phase difference between the portion of the second measurement beam and the portion of the second reference beam, and to determine a difference between the two phase differences. This difference DI between the two phase differences is depicted in FIG. 5 as a function of time. Due to the fact that the first light source LS1 is a stabilized laser source emitting light at a fixed frequency and the fact that the fixed target FT provides a constant optical path length for both the reference path and the measurement path, the difference DI provides an indication of the frequency of the second light source LS2. Hence, when the difference DI has the same value for two different points in time, the frequency of the second light source LS2 was also the same for these two different points. FIG. 5 also depicts nine horizontal lines indicating different value levels of the difference DI. The points in time where a particular line intersects with the difference DI diagram form a set of points in time in which the frequency of the second light source LS2 was identical. Hence, each line corresponds to a different frequency of the second light source LS2.

Figure 6:
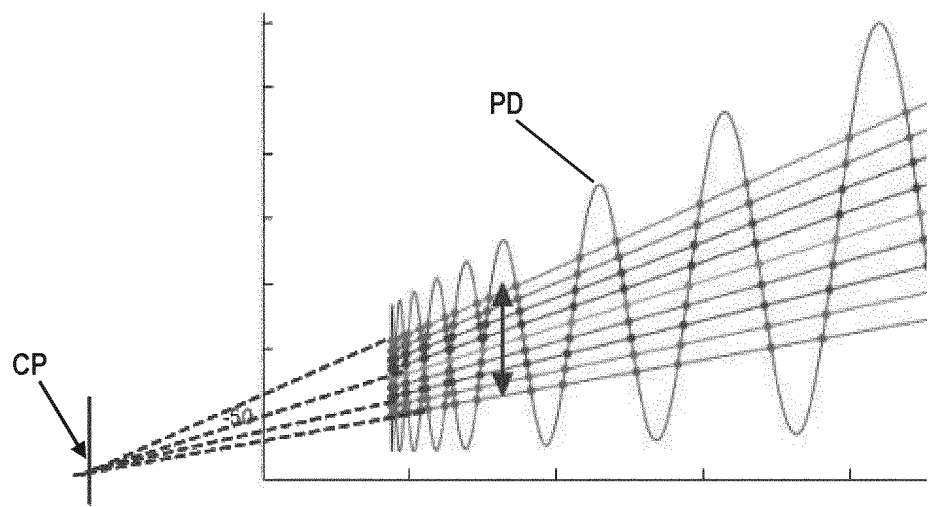
FIG. 6 schematically depicts a diagram with phase differences at different frequencies of the second light source shown in FIG. 5 as a function of position of the moveable target to determine an absolute position of the moveable target.

When the moveable target TA is moved during the time period depicted in FIG. 5, the processing unit PU can use the output signal of the first measurement detector MD1 to determine a phase difference between a portion of the first measurement beam and a portion of the first reference beam and to determine a phase difference between a portion of the second measurement beam and a portion of the second reference beam. FIG. 6 depicts the phase difference PD relating to the second measurement and reference beams as a function of the phase difference relating to the first measurement and reference beams. The dots depicted in FIG. 6 depict the different points in time on the diagram as determined in FIG. 5. Fitting a curve through the dots belonging to the same line of FIG. 5 results in nine curves in FIG. 6 that relate to nine different frequencies of the second light source LS2.

When the nine lines in FIG. 6 are extrapolated to the left, the nine lines converge and a cross-point CP can be determined where the nine lines simultaneously cross. The location of this cross-point CP provides a zero absolute position of the moveable target TA allowing to determine an absolute position of the moveable target relative to the zero absolute position. The zero absolute position may for instance be an optical path length of the measurement path being equal to a path length of the reference path. Or when a reference phase difference is subtracted from the values, the zero absolute position may correspond to the situation that the optical path difference of the moveable target TA is equal to the optical path difference of the fixed target FT.

Figure 7:
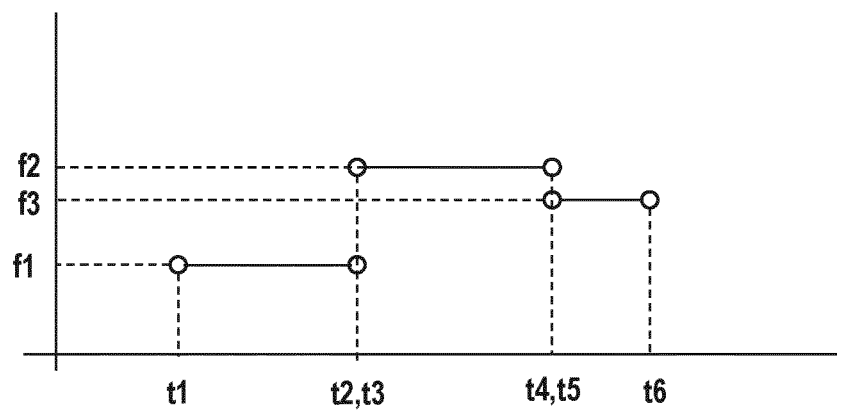
FIG. 7 schematically depicts a diagram indicating the use of three frequencies over time of the second light source.

FIG. 7 depicts a frequency of the second light source LS2 of FIG. 4 according to another embodiment as a function of time in between a time period t1-t6 in which the moveable target TA is moved. In between first points in time t1 and t2, the second light source LS2 has a first frequency f1. In between second points in time t3-t4, the second light source LS2 has a second frequency f2. In between third points in time t5-t6, the second light source LS2 has a third frequency f3. The second light source LS2 may be a tunable laser source as described above for FIGS. 5 and 6, but the second light source LS2 may also be a switchable laser source.

The processing unit PU may be configured to determine the first, second and third points in time, or any other points in time during the respective time intervals. For each of the determined points in time t1-t6, the processing unit PU is configured to determine a phase difference between a portion of the second measurement beam and a portion of the second reference beam on the first measurement detector MD1 and a corresponding phase difference between a portion of the first measurement beam and a portion of the first reference beam on the first measurement detector MD1. This means that for the first points in time t1, t2, first phase differences pd1,t1 and pd1,t2, respectively, are determined as a function of a position of the moveable target TA determined using the first measurement and reference beams. This further means that for the second points in time t3, t4, second phase differences pd2,t3 and pd2,t4, respectively, are determined as a function of a position of the moveable target TA determined using the first measurement and reference beams. This also means that for the third points in time t5, t6, third phase differences pd3,t5 and pd3,t6, respectively are determined as a function of a position of the moveable target TA determined using the first measurement and reference beams. The first, second and third phase differences are plotted in the diagram of FIG. 8 as a function of a position of the moveable target TA determined using the first measurement and reference beams. Straight lines can be drawn between each of the first, second and third phase differences to form a first, second and third curve cu1, cu2, cu3, respectively. Extrapolating the first, second and third curves cu1, cu2, cu3, allows to determine a cross-point CP where all three curves cross and which serves as a zero absolute position allowing to determine an absolute position of the moveable target TA.

Figure 8:
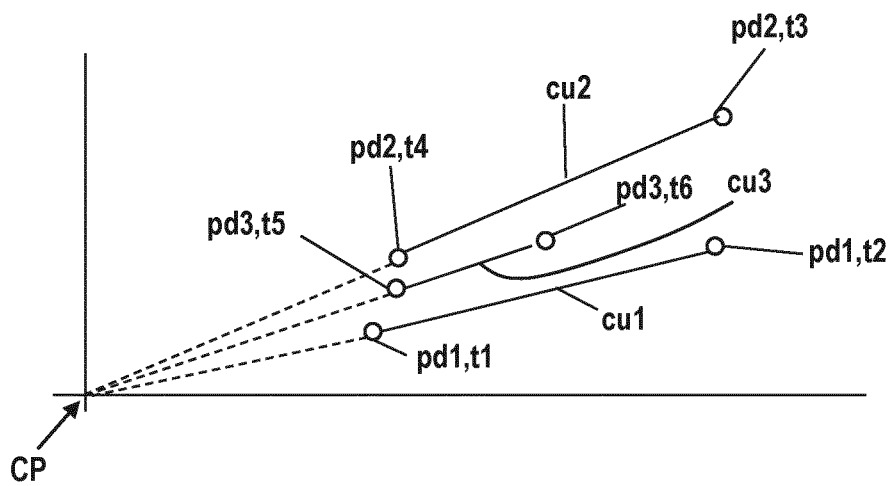
FIG. 8 schematically depicts a diagram with phase differences at different frequencies of the second light source shown in FIG. 7 as a function of position of the moveable target to determine an absolute position of the moveable target.

Although the example of the FIGS. 7 and 8 only uses two points in time per frequency of the second light source LS2, it will be clear that more than two points in time can be used.

Although the example of the FIGS. 7 and 8 uses three different frequencies of the second light source LS2, it will be clear that the processing unit PU is already able to determine the cross-point CP with only two different frequencies, but can also use more than three different frequencies as indicated for instance in FIG. 5 in which nine different frequencies of a continuously modulated laser source are used.

Figure 9:
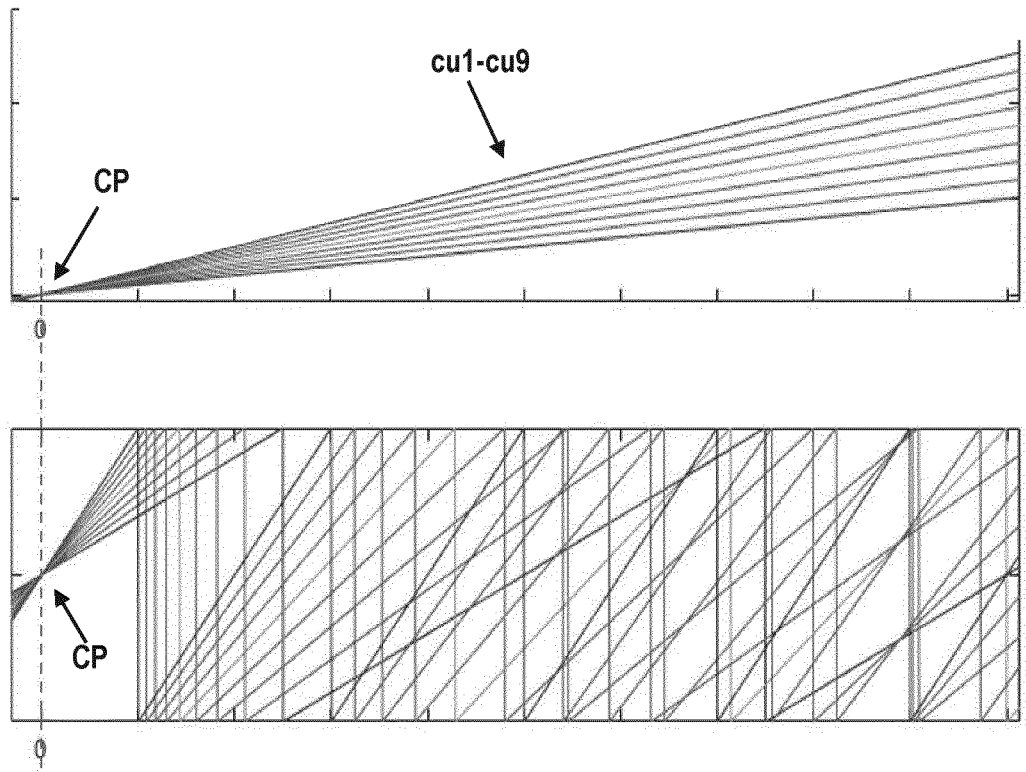
FIG. 9 schematically indicates two different situations of determining a cross-point of extrapolated curves.

FIG. 9 depicts two situations in which nine different frequencies are used. In the top diagram, nine curves cu1-cu9 indicating the phase difference between portions of the second measurement and reference beams as a function of the position of the moveable target TA determined using portions of the first measurement and reference beams form continuous functions when the phase can continuously be tracked, e.g. in the case of a tunable laser, for instance a continuously modulated laser source. When the phase cannot be continuously be tracked, e.g. in the case of a switchable laser source, discontinuous functions may be formed as shown in the bottom diagram of FIG. 9 that make it more difficult to determine the cross-point CP as the curves may also cross at other locations. Where two continuous functions have one unique cross-point and thus where only two frequencies suffice to find the zero absolute position, the use of discontinuous functions may require more frequencies to find the cross-point where all discontinuous functions cross simultaneously. Additional frequencies may be added by configuring the second light source LS2 to emit light at more different frequencies. However, it is also possible to create additional synthetic frequencies from the available frequencies of the first and second light sources LS1,LS2. For instance, when the first light source LS1 emits light with a wavelength of WL1 and the second light source LS2 is able to emit light with a wavelength WL2 and WL3, the following three synthetic wavelengths may be created:

WL12=WL1*WL2/(WL1−WL2) having a phase difference that is a difference between the phase differences associated with the wavelengths WL1 and WL2;

WL13=WL1*WL3/(WL1−WL3) having a phase difference that is a difference between the phase differences associated with the wavelengths WL1 and WL3; and WL23=WL2*WL3/(WL2−WL3) having a phase difference that is a difference between the phase differences associated with the wavelengths WL2 and WL3.

However, there are also other ways of creating synthetic wavelengths and/or ways available to created additional wavelengths. The curves associated with these synthetic wavelengths can be used to find the cross-point CP more accurately.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A positioning system to determine an absolute position of a moveable target relative to a reference, comprising:
   a measurement system to measure a position of the moveable target;
   an actuator system to move the moveable target; and
   a control unit to control the measurement system and the actuator system,
   wherein the measurement system comprises an interferometer system with a first light source configured to emit a first light beam at a fixed frequency, a second light source configured to emit a second light beam and is able to output the second light beam at a first frequency and at a second frequency, and an optics system configured to allow a portion of the first light beam to interact with the moveable target and another portion of the first light beam to travel along a fixed reference path, and to allow a portion of the second light beam to interact with the moveable target and another portion of the second light beam to travel along the fixed reference path, and wherein the control unit is configured to determine an absolute position of the moveable target relative to a reference by:

moving the moveable target;

driving the second light source such that during one or more portions of the moving of the moveable target the second light beam has the first frequency and during one or more other portions of the moving of the moveable target the second light beam has the second frequency;

determining at least two first points in time where the second light source has the first frequency;

determining at least two second points in time where the second light source has the second frequency;

determining for each of the at least two first points in time a first phase difference between portions of the second light beam as a function of a position of the moveable target determined by a phase difference between portions of the first light beam;

determining for each of the at least two second points in time a second phase difference between portions of the second light beam as a function of a position of the moveable target determined by a phase difference between portions of the first light beam;

extrapolating a first curve fitted through the first phase differences and extrapolating a second curve fitted through the second phase differences; and determining a cross-point of the extrapolated first curve and the extrapolated second curve in order to determine an absolute position of the moveable target relative to the reference.

2. The positioning system according to claim 1, wherein the first light source is configured to emit a pair of first light beams having a first split frequency, wherein the second light source is configured to emit a pair of second light beams having a second split frequency, and wherein the interferometer system further comprises:

a reference detector;

a measurement detector;

a beam splitter to split each light beam of the first and second light sources into a first portion directed towards the reference detector and a second portion directed towards the measurement detector; and a processing unit, wherein the optics system is configured to allow the second portion of one of the first light beams and the second portion of one of the second light beams to travel along a reference path with a fixed optical path length towards the measurement detector and to allow the second portion of the other one of the first light beams and the second portion of the other one of the second light beams to travel along a measurement path including the moveable target towards the measurement detector, wherein the processing unit is configured to process an output signal of the reference detector and an output signal of the measurement detector to determine a first reference phase between the first portions of the first light beams, a second reference phase between the first portions of the second light beams, a first measurement phase between the second portions of the first light beams, and a second measurement phase between the second portions of the second light beams, and wherein the control unit is configured to determine the first phase difference based on a difference between the second reference phase and the second measurement phase, to determine the second phase difference based on a difference between the second reference phase and the second measurement phase, and to determine the phase difference between portions of the first light beam based on a difference between the first reference phase and the first measurement phase.

3. The positioning system of claim 1, wherein the first light source includes a stabilized laser source.

4. The positioning system of claim 1, wherein the second light source includes a tunable laser source.

5. The positioning system of claim 1, wherein the second light source is a switchable laser source.

6. The positioning system of claim 1, wherein the second light source is able to output the second light beam at a third frequency, and wherein the control unit is further configured to:

drive the second light source such that during one or more further portions of the moving of the moveable target the second light beam has the third frequency;

determine at least two third points in time where the second light source has the third frequency;

determine for each of the at least two third points in time a third phase difference between portions of the second light beam as a function of a position of the moveable target determined by a phase difference between portions of the first light beam;

extrapolate a third curve fitted through the third phase differences; and determine a cross point of the extrapolated first curve, the extrapolated second curve, and the extrapolated third curve in order to determine an absolute position of the moveable target relative to the reference.

7. The positioning system of claim 1, wherein the control unit is further configured to:

determine a first synthetic phase difference for each of the at least two first points in time based on a combination of the respective first phase difference and the respective phase difference between portions of the first light beam; and extrapolate a first synthetic curve fitted through the first synthetic phase differences; and determine a cross-point of all available extrapolated curves in order to determine an absolute position of the moveable target relative to the reference.

8. The positioning system of claim 1, wherein the control unit is further configured to:

determine a second synthetic phase difference for each of the at least two second points in time based on a combination of the respective second phase difference and the respective phase difference between portions of the first light beam;

extrapolate a second synthetic curve fitted through the second synthetic phase differences; and determine a cross-point of all available extrapolated curves in order to determine an absolute position of the moveable target relative to the reference.

9. The positioning system of claim 1, wherein at least two first points in time coincide with at least two second points in time, and wherein the control unit is further configured to:

determine a third synthetic phase difference for each of the at least two coinciding first and second points in time based on a combination of the respective first phase difference and the respective second phase difference;

extrapolate a third synthetic curve fitted through the third synthetic phase differences; and determine a cross-point of all available extrapolated curves in order to determine an absolute position of the moveable target relative to the reference.

10. The positioning system of claim 1, wherein the optics system is further configured to allow a portion of the first light beam to interact with a fixed target and to allow a portion of the second light beam to interact with the fixed target, and wherein preferably the control unit is configured to use a phase difference between a portion of the second light beam interacting with the fixed target and a portion of the second light beam traveling along the fixed reference path and a phase difference between a portion of the first light beam interacting with the fixed target and a portion of the first light beam traveling along the fixed reference path to determine the at least two first points in time and the at least two second points in time.

11. The positioning system of claim 2, wherein the interferometer system further comprises a further measurement detector, and wherein the optics system is configured to:

allow a portion of the second portion of one of the first light beams and a portion of the second portion of one of the second light beams to travel along a reference path with a fixed optical path length towards the measurement detector and to allow another portion of the second portion of the one of the first light beams and another portion of the second portion of the one of the second light beams to travel along a reference path with a fixed optical path length towards the further measurement detector; and allow a portion of the second portion of the other one of the first light beams and a portion of the second portion of the other one of the second light beams to travel along a measurement path including the moveable target towards the measurement detector and to allow another portion of the second portion of the other one of the first light beams and another portion of the second portion of the other one of the second light beams to travel along a measurement path including the fixed target towards the further measurement detector.

12. A lithographic apparatus comprising a moveable target and the positioning system of claim 1.

13. The lithographic apparatus of claim 12, further comprising:

an illumination system configured to condition a radiation beam;

a support constructed to support a patterning device, the patterning device being capable of imparting the radiation with a pattern in its cross-section to form a patterned radiation beam;

a substrate table constructed to hold a substrate; and a projection system configured to project the patterned radiation beam onto a target portion of the substrate, wherein the moveable target is the support or the substrate table.

14. A method for determining an absolute position of a moveable target relative to a reference using an interferometer system with a first light source configured to emit a light beam at a fixed frequency and a second light source configured to emit a second light beam and is able to output the second light beam at a first frequency and at a second frequency, wherein a portion of the first light beam interacts with the moveable target and another portion of the first light beam travels along the fixed reference path, wherein a portion of the second light beam interacts with the moveable target and another portion of the second light beam travels along the fixed reference path, the method comprising:

moving the moveable target;

driving the second light source such that during one or more portions of the movement of the moveable target the second light beam has the first frequency and during one or more other portions of the movement of the moveable target the second light beam has the second frequency;

determining at least two first points in time where the second light source has the first frequency;

determining at least two second points in time where the second light source has the second frequency;

determining for each of the at least two first points in time a first phase difference between portions of the second light beam as a function of a position of the moveable target determined by a phase difference between portions of the first light beam;

determining for each of the at least two second points in time a second phase difference between portions of the second light beam as a function of a position of the moveable target determined by a phase difference between portions of the first light beam;

extrapolating a first curve fitted through the first phase differences and extrapolating a second curve fitted through the second phase differences; and determining a cross-point of the extrapolated first curve and the extrapolated second curve in order to determine an absolute position of the moveable target relative to the reference.

15. The method of claim 12, wherein a portion of the first light beam and a portion of the second light beam interact with a fixed target, wherein the second light source is continuously modulated, and wherein the at least two first points in time and the at least two second points in time are determined by using a phase difference between portions of the first and second light beams interacting with the fixed target.

16. The method of claim 12, wherein the second light source is switched between the first and second frequencies during moving of the moveable target, wherein the method further includes a step of creating one or more synthetic curves using a combination of the fixed frequency with the first frequency or the second frequency or using a combination of the first and second frequencies, and wherein the absolute position of the moveable target is determined by determining a cross-point of the first curve, the second curve and the one or more synthetic curves.

17. A device manufacturing method utilizing the lithographic apparatus of claim 12.

18. A heterodyne interferometer system comprising:

a first light source configured to emit a light beam at a fixed frequency;

a second light source configured to emit a second light beam and is able to output the second light beam at a first frequency and at a second frequency;

an optics system configured to allow a portion of the first light beam to interact with a moveable target and another portion of the first light beam to travel along a fixed reference path, and to allow a portion of the second light beam to interact with the moveable target and another portion of the second light beam to travel along the fixed reference path; and a control unit, wherein the control unit is configured to determine an absolute position of the moveable target relative to a reference by:

driving the second light source such that during one or more portions of a movement of the moveable target the second light beam has the first frequency and during one or more other portions of the movement of the moveable target the second light beam has the second frequency;

determining at least two first points in time where the second light source has the first frequency;

determining at least two second points in time where the second light source has the second frequency;

determining for each of the at least two first points in time a first phase difference between portions of the second light beam as a function of a position of the moveable target determined by a phase difference between portions of the first light beam;

determining for each of the at least two second points in time a second phase difference between portions of the second light beam as a function of a position of the moveable target determined by a phase difference between portions of the first light beam;

extrapolating a first curve fitted through the first phase differences and extrapolating a second curve fitted through the second phase differences; and determining a cross-point of the extrapolated first curve and the extrapolated second curve in order to determine an absolute position of the moveable target relative to the reference.

* * * * *

UNITED STATES PATENT AND TRADEMARK OFFICE
CERTIFICATE OF CORRECTION

PATENT NO. : 12,306,548 B2
APPLICATION NO. : 18/037641
DATED : May 20, 2025
INVENTOR(S) : Jansen Page 1 of 1

It is certified that error appears in the above-identified patent and that said Letters Patent is hereby corrected as shown below:

On the Title Page

Column 2, Item (57), under "Abstract", Line 5, delete "at least" and insert -- atleast --, therefor.

In the Claims

In Column 18, Claim 14, Line 4, delete "the" and insert -- a --, therefor.

In Column 18, Claim 15, Line 37, delete "claim 12," and insert -- claim 14, --, therefor.

In Column 18, Claim 16, Line 45, delete "claim 12," and insert -- claim 14, --, therefor.

Signed and Sealed this
Twenty-fourth Day of June, 2025

Coke Morgan Stewart
*Acting Director of the United States Patent and Trademark Office*